(12) United States Patent
Yamagiwa

(10) Patent No.: US 7,944,690 B2
(45) Date of Patent: May 17, 2011

(54) HOUSING, ELECTRONIC EQUIPMENT, AND HOUSING DISASSEMBLY METHOD

(75) Inventor: Daisuke Yamagiwa, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 177 days.

(21) Appl. No.: 12/358,677

(22) Filed: Jan. 23, 2009

(65) Prior Publication Data
US 2009/0190291 A1 Jul. 30, 2009

(30) Foreign Application Priority Data

Jan. 24, 2008 (JP) .................................. 2008-013849

(51) Int. Cl.
*H05K 7/12* (2006.01)
(52) U.S. Cl. .............. 361/679.58; 361/679.56; 29/426.1
(58) Field of Classification Search ............. 361/679.01, 361/679.02, 679.55, 679.56, 679.58; 29/426.1
See application file for complete search history.

(56) References Cited

U.S. PATENT DOCUMENTS 7,103,892 B2 * 9/2006 Law .............................. 720/600

FOREIGN PATENT DOCUMENTS

| JP | 2002-358748 A | 12/2002 |
| JP | 2004-221121 A | 8/2004 |
| JP | 2005-44919 A | 2/2005 |
| JP | 2005-108990 A | 4/2005 |
| JP | 2007-5701 A | 1/2007 |

* cited by examiner

*Primary Examiner* — Jayprakash N Gandhi
*Assistant Examiner* — Ingrid Wright
(74) *Attorney, Agent, or Firm* — Crowell & Moring LLP

(57) ABSTRACT

A housing, comprises: a first housing part, one side of which is an opening, including a hook member having a hook at its tip and projected from an inner surface thereof; and a second housing part, one side of which is an opening, having an engagement recess to be engaged with the hook, wherein the openings of the first housing part and the second housing part are closed by engaging the engagement recess and the hook to make a closed space inside, the hook member has a recess to which a release member is insertable from an outer surface of the first housing part, an engagement state of the hook and the engagement recess is released by bending the hook member by the release member inserted into the recess of the engagement recess.

6 Claims, 14 Drawing Sheets

HOUSING, ELECTRONIC EQUIPMENT, AND HOUSING DISASSEMBLY METHOD

BACKGROUND OF THE INVENTION

1. Field of the Invention

The invention relates to a housing, an electronic equipment, and a housing disassembly method.

2. Description of Related Art

Conventionally, in a housing used for an electronic equipment, and so on, a first housing part has a hook and the second housing part has an engagement portion to be engaged with the hook in order to engage the first housing part and a second housing part in a state capable of disassembling it.

Specifically, for example, in a housing used for an electronic equipment, and so on, there is proposed an equipment comprising first housing part having a locking nail (a hook) and a second housing part having a lock projection (engagement portion), a movable piece and a tool insertion hole, wherein an engagement state of the locking nail and the lock projection is released by bending the movable piece using a tool inserted into the tool insertion hole (For example, see Japanese Patent Laid-Open No. 2005-44919).

As a still further example, in an electronic equipment, there is proposed an equipment comprising a cover body attached to a main body housing of the electronic equipment, a latch nail (a hook) provided to the cover body, and an engagement hole (engagement portion) provided thorough the main body housing, wherein the engagement state of the latch nail and the engagement hole is released by pushing the latch nail using a tool inserted into the engagement hole (For example, see Japanese Patent Laid-Open No. 2005-108990).

As a still further example, in a housing used for an electronic equipment, and so on, there is provided an equipment comprising a first member having an engagement hole (engagement portion) and a bending guide portion and a second member having a hook member (a hook) and an opening for push, wherein the opening for push is provided at a portion opposite to the bending guide section, wherein an engagement state of the engagement hole and the hook member is released by pushing the bending guide portion by a pushing member inserted into the opening for push to bend the bending guide portion (For example, see Japanese Patent Laid-Open No. 2004-221121).

As a still further example, there is provided a remote control case comprising a first case part having a hook member (a hook), and a second case part having an engagement portion and hole portion, wherein an engagement state of the hook member and an engagement portion is released by pushing the hook member by a release bar inserted into the hole portion and bending the hook member (For example, see Japanese Patent Laid-Open No. 2007-5701).

As a still further example, there is proposed a main body case of a recording media cartridge composed of an upper case and a lower case which are combined in a capping state, comprising a locking member formed in a recess shape, a projection (a hook) provided on an internal surface of both end portions of the locking member, a recess portion (an engagement portion) provided on an upper case and a lower case, wherein a recess for engagement release is provided on an upper end of the locking member, and an engagement state of the projection and the recess is released by hooking a tool like a screwdriver to a recess for lock release and urging it outside (For example, see Japanese Patent Laid-Open No. 2002-358748).

SUMMARY OF THE INVENTION

However, In the invention described in Japanese Patent Laid-Open No. 2005-44919, though a tool insertion hole is closed inside of the second housing part in a bag shape in order not to damage a substrate of housing inside, there is the problem that the degree of closure can not be obtained because notch is formed in a portion adjacent to movable pieces in order to make the movable pieces movable.

Also, In the invention described in Japanese Patent Laid-Open No. 2005-108990 and Japanese Patent Laid-Open No. 2004-221121, though the structures can provide the degree of closure of the electronic equipment inside, there is the problem that the external surface of the latch nail or the bending guide section will get damaged because the engagement state is released by pushing the latch nail by the tool or pushing the bending guide portion by a pushing member.

Also, in the invention described in Japanese Patent Laid-Open No. 2007-5701, there is a problem that the degree of closure of a remote controller (an electronic equipment) inside can not be obtained because a hole is provided in the second case part.

Also, in the invention described in Japanese Patent Laid-Open No. 2002-358748, there is a problem that the number of parts increases because the locking member is required separately in order to engage the upper case and the lower case. Further, in the invention described in Japanese Patent Laid-Open No. 2002-358748, there is a problem that the external surface of the locking member will get damaged because the engagement state is released by hooking the tool to the recess for the lock release.

It is, therefore, a main object of the present invention to provide a housing capable of obtaining the degree of closure of inside and reducing a damage of an outside view when performing disassembly without increasing the number of parts, and an electronic equipment comprising the housing, and a housing disassembly method.

In accordance with a first aspect of the present invention, a housing, comprises:

a first housing part, one side of which is an opening, including a hook member having a hook at its tip and projected from an inner surface thereof; and a second housing part, one side of which is an opening, having an engagement recess to be engaged with the hook, wherein the openings of the first housing part and the second housing part are closed by engaging the engagement recess and the hook to make a closed space inside, the hook member has a recess to which a release member is insertable from an outer surface of the first housing part, an engagement state of the hook and the engagement recess is released by bending the hook member by the release member inserted into the recess of the hook member.

In accordance with a second aspect of the present invention, there is provided the housing according to the first aspect, wherein the hook member is arranged almost in a vertical direction with respect to an engagement recess depth direction in a state where the hook and the engagement recess are engaged, the recess of the hook member is extendedly provided from the outer surface of the first housing part to inside of the hook member almost in a vertical direction with respect to the engagement recess depth direction in a state where the hook and the engagement recess are engaged, the engagement state of the hook and the engagement recess is released by inserting the release member formed almost in a bar shape into the recess of the hook member and inclining the tip of the inserted releasing member to a direction opposite to the engagement recess depth direction to bend the hook member, and the first housing part has a notch portion in position of the engagement recess depth direction in an opening edge portion of the recess of the hook member in a state where the hook and the engagement recess are engaged.

In accordance with a third aspect of the present invention, there is provided the housing according to the first aspect, wherein the hook member is arranged almost in a vertical direction with respect to the engagement recess depth direction in a state where the hook and the engagement recess are engaged, the recess of the hook member is extendedly provided from the outer surface of the first housing part to inside of the hook member almost in a vertical direction with respect to the engagement recess depth direction in a state where the hook and the engagement recess are engaged, and the engagement state of the hook and the engagement recess is released by inserting the release member formed almost in a bow shape into the recess of the hook member and bending the hook member by the inserting.

In accordance with a fourth aspect of the present invention, there is provided an electronic equipment comprising the housing according to any one of first to third aspects.

In accordance with a fifth aspect of the present invention, there is provided a housing disassembly method of disassembling the housing according to the second aspect to the first housing part and the second housing part, the method comprising:

an insertion step of inserting the release member to the recess of the hook member;

a release step of releasing the engagement state of the hook and the engagement recess by inclining the tip of the releasing member inserted into the recess of the hook member to a direction opposite to the engagement recess depth direction to bend the hook member;

a disassembling step of disassembling the housing to the first housing part and the second housing part by separating the first housing part and the second housing part in a state where the engagement state of the hook and the engagement recess are released, wherein the release member is covered by a predetermined elastic member in at least a portion opposite to the opening edge portion of the recess of the hook member when the release member has been inserted into the recess of the hook member.

In accordance with a sixth aspect of the present invention, there is provided the housing disassembling method of disassembling the housing according to claim 3 to the first housing part and the second housing part, the method comprising:

an insertion release step of releasing the engagement state of the hook and the engagement recess by inserting the release member and bending the hook member by the inserting; and a disassembling step of disassembling the housing to the first housing part and the second housing part by separating the first housing part and the second housing part in a state where the engagement state of the hook and the engagement recess are released.

BRIEF DESCRIPTION OF THE DRAWINGS

The above and other objects, advantages and features of the present invention will become more fully understood from the detailed description given below and the appended drawings, and the following descriptions pertain to the embodiment of the present invention are not intended to limit the present invention, and wherein.

DESCRIPTION OF THE PREFERRED EMBODIMENTS

In the following embodiments, the features and the operations of an image forming apparatus of the present invention will described in detail with reference to the attached drawings.

In the following, the best mode for carrying out the invention will be described in detail with reference to the drawings. It should be noted that the scope of the invention is not limited to the illustrated embodiments.

First the Embodiment

First, a housing 1 of the first the embodiment, an electronic equipment 1000 comprising the housing 1, and a disassembly method for disassembling the housing 1 to a first housing part 11 and a second housing part 12 will be described.

Figure 1:
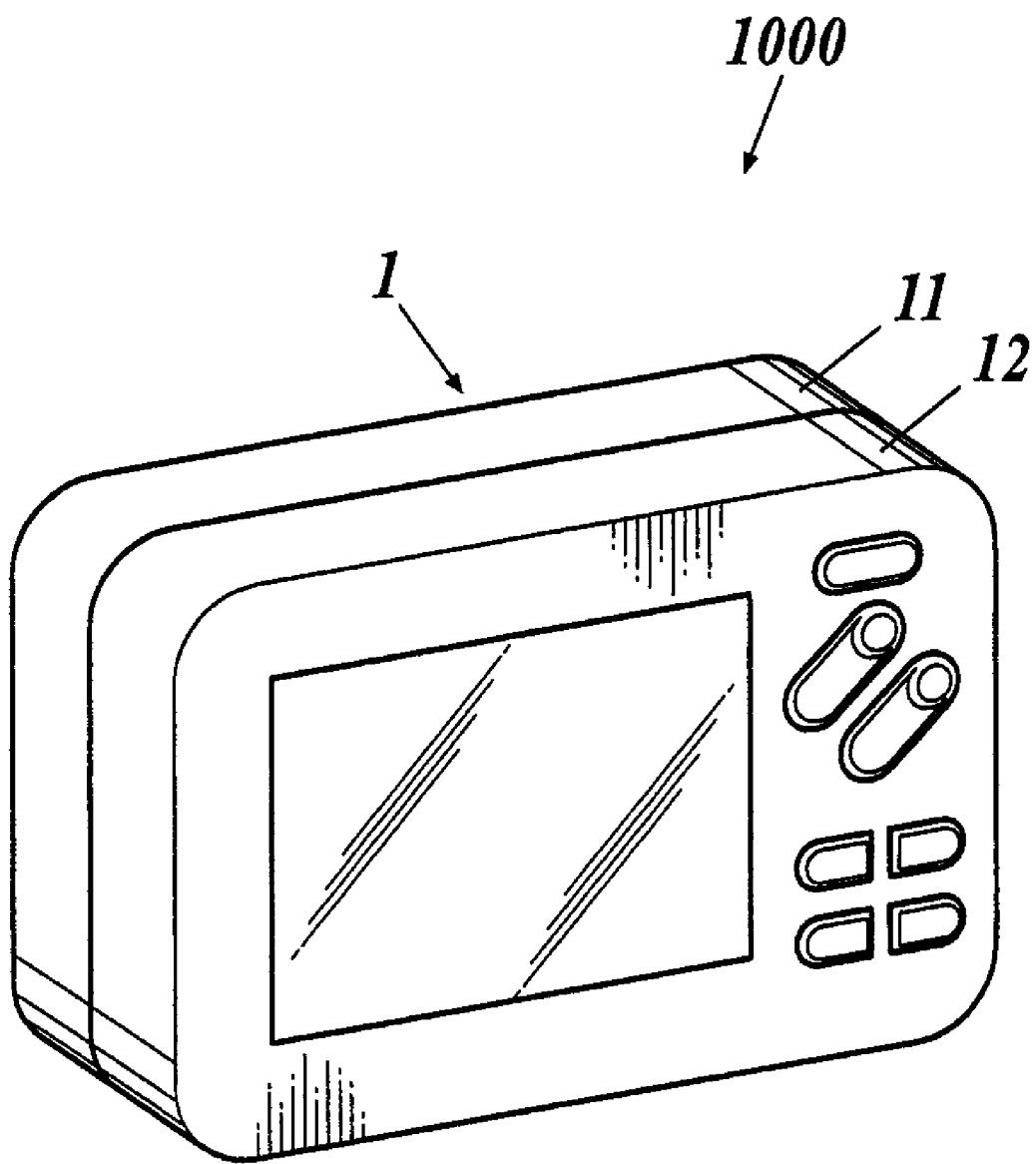
FIG. 1 is a front perspective diagram of a portable television as an example of an electronic equipment in the first embodiment.
Figure 2:
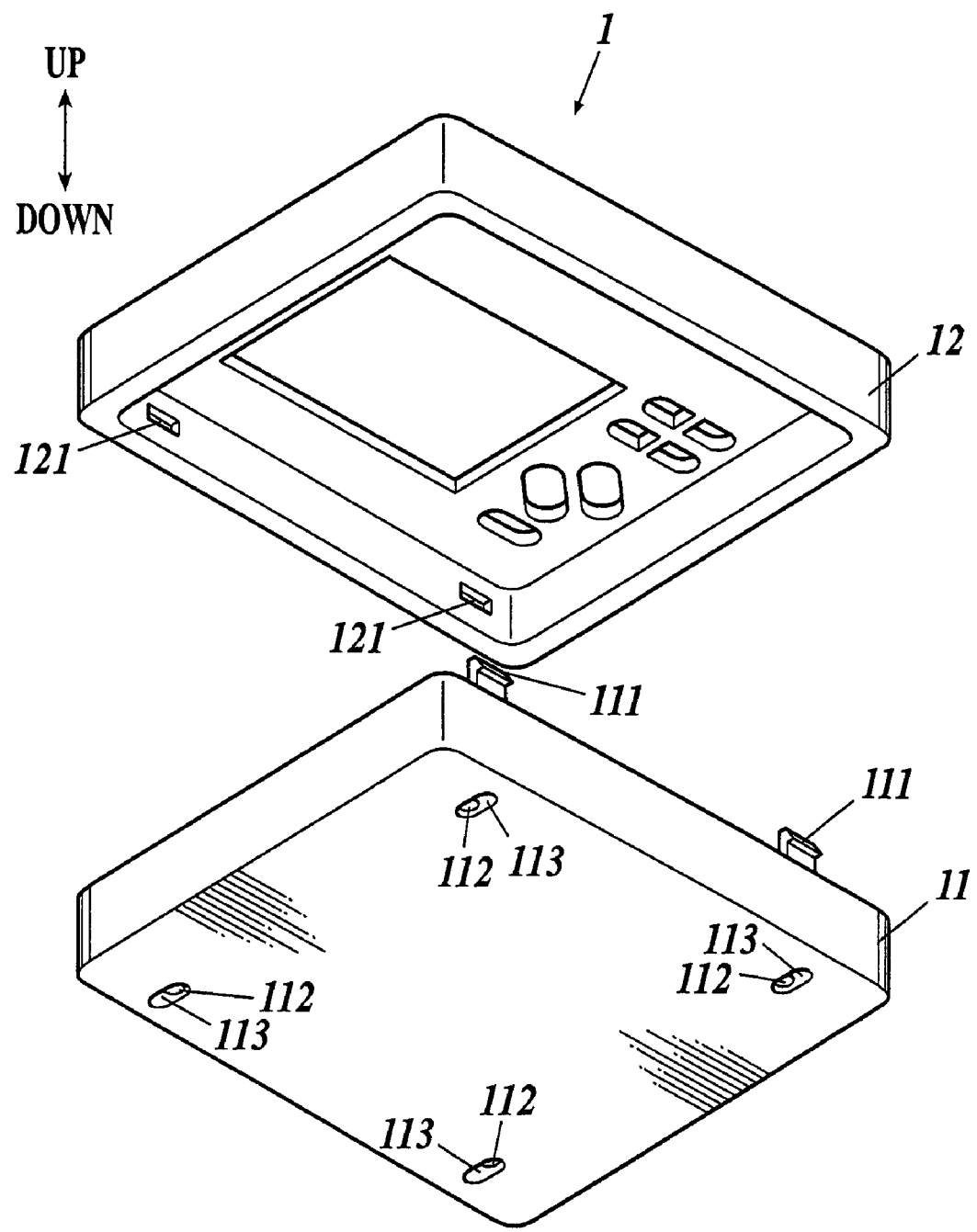
FIG. 2 is a back perspective diagram showing a state where a housing in the first embodiment has been disassembled to a first housing part and a second housing part.

Here, FIG. 1 is a front perspective diagram of a portable television as an example of an electronic equipment 1000, FIG. 2 is a perspective diagram showing a state where a housing 1 in the first embodiment has been disassembled to a first housing part 11 and a second housing part 12, and FIG. 3 to FIG. 7 are principal part sectional views of the housing 1.

In FIG. 2, in the housing 1, a side on which the first housing part 11 is arranged indicates a lower side, and a side on which the second housing part 12 is arranged indicates an upper side. Also, in FIG. 3 to FIG. 7, in the housing 1, a side on which the first housing part 11 is arranged indicates a lower side, and a side on which the second housing part 12 is arranged indicates an upper side. Further, a depth direction of engagement recess 121 indicates left, and a direction opposite to the depth direction of the engagement recess 121 indicates right.

<Electronic Equipment>

For example, the electronic equipment 1000 has the housing 1 obtained by combining the first housing part 11 and the second housing part 12, as shown in FIG. 1.

Specifically, the electronic equipment 1000 is e.g. a portable television as shown in FIG. 1.

In addition, the electronic equipment 1000 is not limited to the portable television, and is adapted to any electronic equipment. As a preferable electronic equipment 1000, there is an electronic equipment which needs to ensure the degree of closure of inside of the housing 1 such as a portable television, or the like which is used outdoors with high possibility. Specifically, for example, there are a digital camera, a digital video camera, a portable audio player, etc. other than the portable television.

<Housing>

Figure 3:
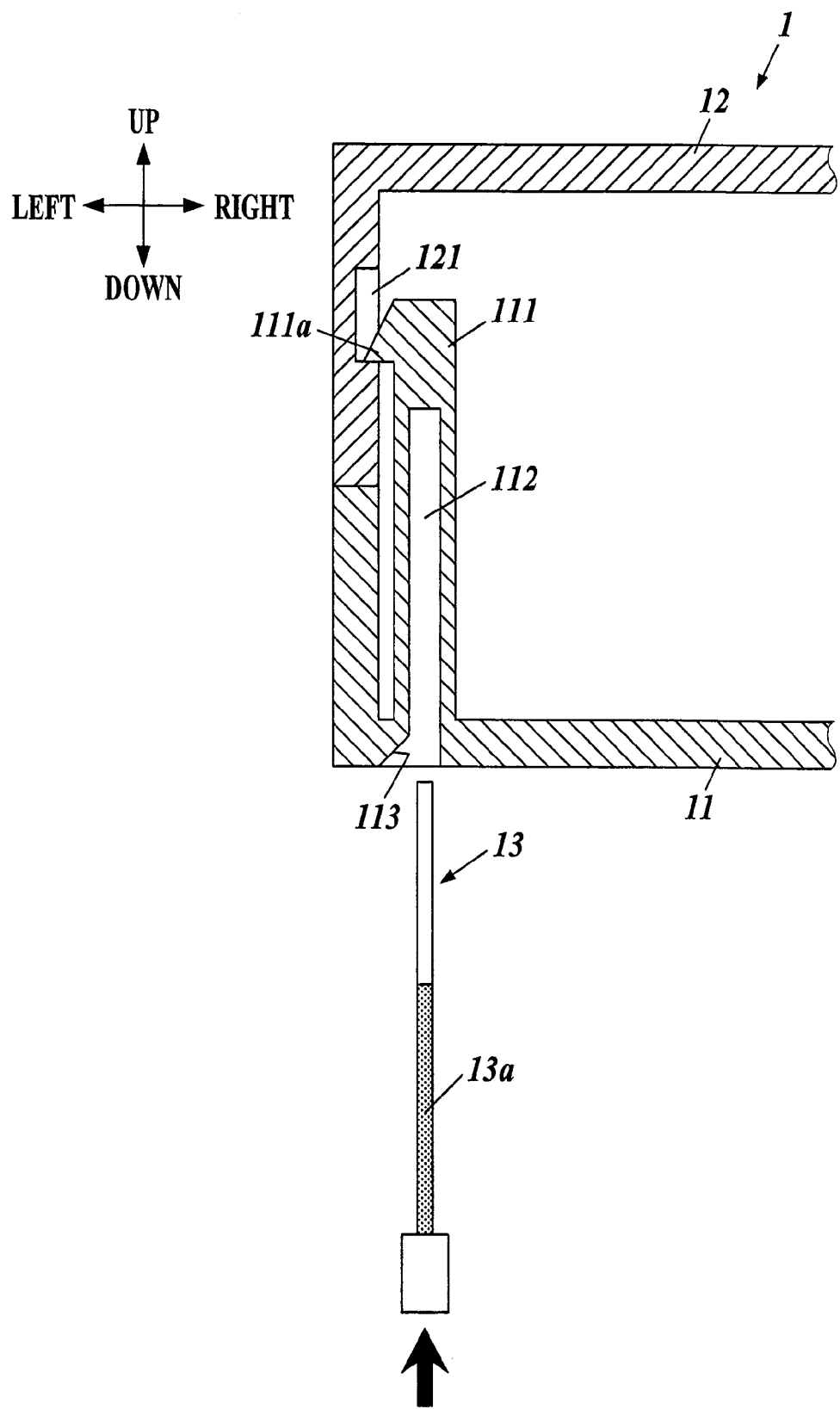
FIG. 3 is a principal part sectional view of a housing in the first embodiment in a state where a hook and an engagement recess have been engaged, and a diagram showing a state where the release member is not inserted into a recess.

For example, the housing (housing) 1 is almost rectangular parallelepiped shape of its outline as shown in FIG. 1 to FIG. 3. For example, as shown in FIG. 2 and FIG. 3, the housing 1 is obtained by combining the first housing part 11 and the second housing part 12 which are divided almost at the center position of the vertical direction.

Specifically, the housing 1 includes the first housing part 11, one side of which is an opening, including a hook member 111 having a hook 111*a* at its tip, and the second housing part 12, one side of which is an opening, having the engagement recess 121 to be engaged with the hook 111*a* in a side surface.

In the housing 1, the opening side of the first housing part 11 and the opening side of the second housing part 12 are overlapped, and the openings of the first housing part 11 and the second housing part 12 are closed by engaging the engagement recess 121 and the hook 111*a* to make a closed space inside.

Then, in the housing 1, an engagement state of the hook 111*a* and the engagement recess 121 is released by bending the hook member 111 by a release member 13 formed almost in a bar shape.

The first housing part 11 is formed by e.g. resin and so on. For example, the first housing part 11 has the opening in the one side (e.g. an upper side), and the hook member 111 is projected from an inner surface of a side (a lower side) opposite to the opening side to the opening side (e.g. the upper side). That is, the hook member 111 is arranged almost in a vertical direction with respect to a depth direction of an engagement recess 121 in a state where the hook 111*a* and the engagement recess 121 are engaged.

The hook member 111 is provided in position capable of engaging to the engagement recess 121 corresponding to the hook 111*a* of the hook member 111. Specifically, for example, the hook member 111 is provided near the side surface (left side in FIG. 3) of the first housing part 11 because the engagement recess 121 is provided in the side surface (left side in FIG. 3) of the second housing part 12.

The shape of the horizontal direction cross section of the hook member 111 is arbitrary and e.g. almost rectangular shape.

The hook member 111 has the hook 111*a* projecting to a depth direction of the corresponding engagement recess 121 in a state where the hook 111*a* and the engagement recess 121 are engaged.

The height (length of vertical direction) of the hook member 111 is set to a height capable of engaging the hook 111*a* of the hook member 111 and the corresponding engagement recess 121. Specifically, the height of the hook member 111 is set so as to arrange the hook 111*a* of the hook member 111 in a side upper than an upper edge of the side surface (left side in FIG. 3) of the first housing part 11 because the engagement recess 121 is provided on the side surface (left side in FIG. 3) of the second housing part 12.

The hook member 111 has a recess 112 formed so as to be capable of inserting a release member 13 from the outer surface of the first housing part 11.

the recess 112 is extendedly provided from the outer surface of the first housing part 11 to inside of the hook member 111 almost in a vertical direction with respect to the depth direction of the engagement recess 121 in a state where the hook 111*a* and the engagement recess 121 are engaged.

In addition, the shape of the horizontal direction cross section of the recess 112 is arbitrary and e.g. almost round shape.

In an opening edge portion of the recess 112 in the first housing part 11, for example, a notch portion 113 is provided in position of the depth direction of the engagement recess 121 of the opening edge portion of the recess 112 in a state where the hook 111*a* and the engagement recess 121 are engaged.

Specifically, the notch portion 113 is formed by cutting in position to the depth direction (left side in FIG. 3) of the engagement recess 121 in the opening edge portion of the recess 112 so as to incline toward the opening side (lower side in FIG. 3) of the recess 112 and the depth direction (left direction in FIG. 3) of the engagement recess 121.

Here, notch portion 113 is provided so as to fully incline the release member 13 and when bending the hook member 111 in order to release the engagement state of the hook member 111*a* and the engagement recess 121 without disturbing by the opening edge portion of the recess 112.

The second housing part 12 is formed by resin, or the like. For example, the second housing part 12 has an opening on one side (e.g. lower side), and the engagement recess 121 formed by e.g. depressing its inner surface like concave in the inner surface of a almost vertical side with respect to the opening side.

<Release Member>

For example, as shown in FIG. 3, the release member 13 is a member formed almost in a bar shape and used when releasing the engagement state of the hook 111*a* and the engagement recess 121. As the release member 13, a tool commercially available such as a screwdriver, and so on or a dedicated member for disassembling the housing 1 to the first housing part 11 and the second housing part 12 may be used if it is formed almost in the bar shape and difficult to bend in comparison with the hook member 111. For example, as shown in FIG. 3, as a preferable release member 13, there is a member covered by a predetermined elastic member 13*a* in at least a portion opposite to the opening edge portion of the recess 112 when inserting it into the recess 112. Here, the predetermined elastic member 13a is arbitrary if it has a member having cushioning properties, such as rubber.

<Disassembly Method of Housing>

A disassembly method of disassembling the housing to the first housing part 11 and the second housing part 12 is described in view of FIG. 3 to FIG. 7.

Figure 4:
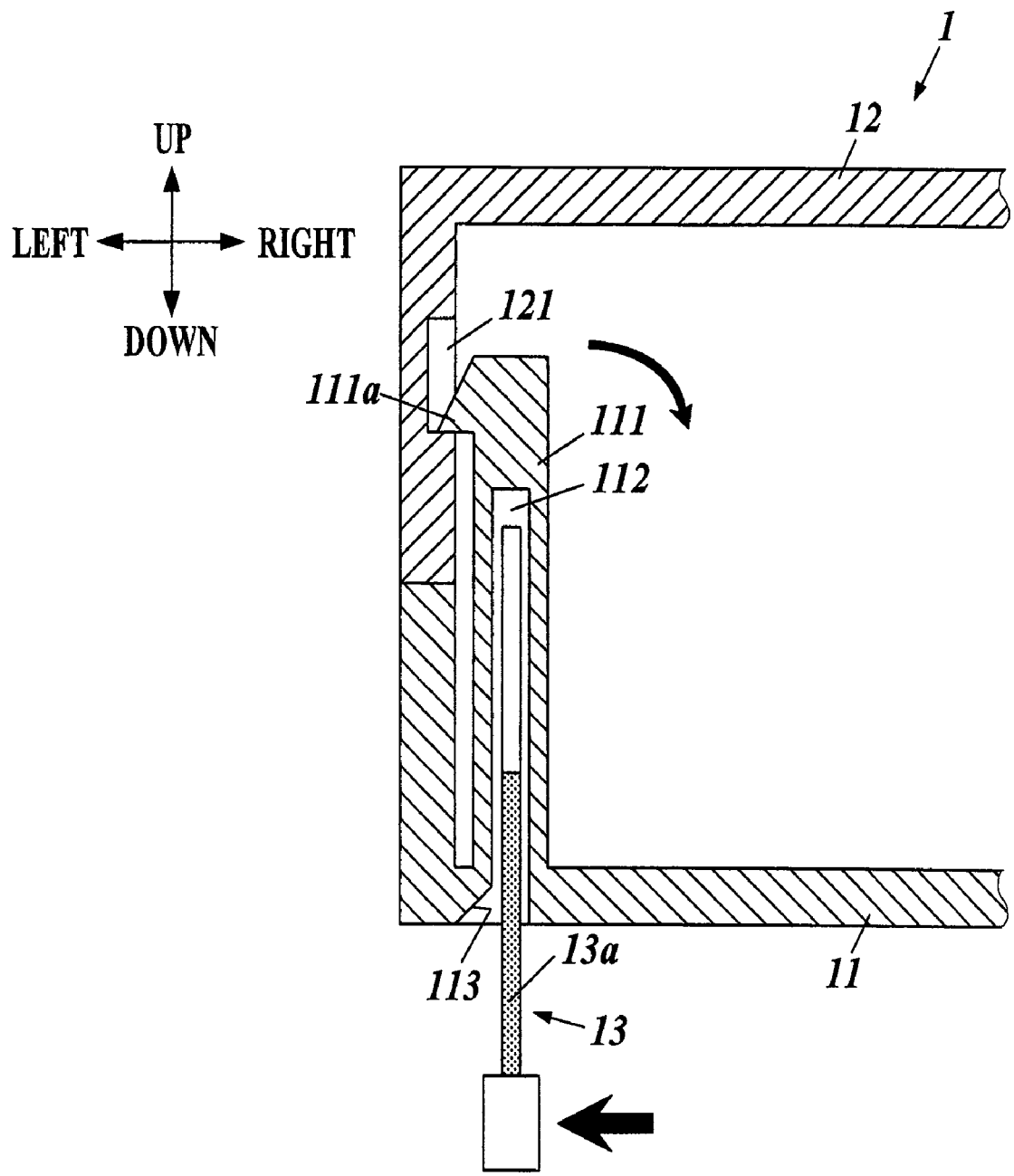
FIG. 4 is a principal part sectional view of a housing in the first embodiment in a state where a hook and an engagement recess are engaged, and a diagram showing a state where the release member has been inserted into a recess.
Figure 5:
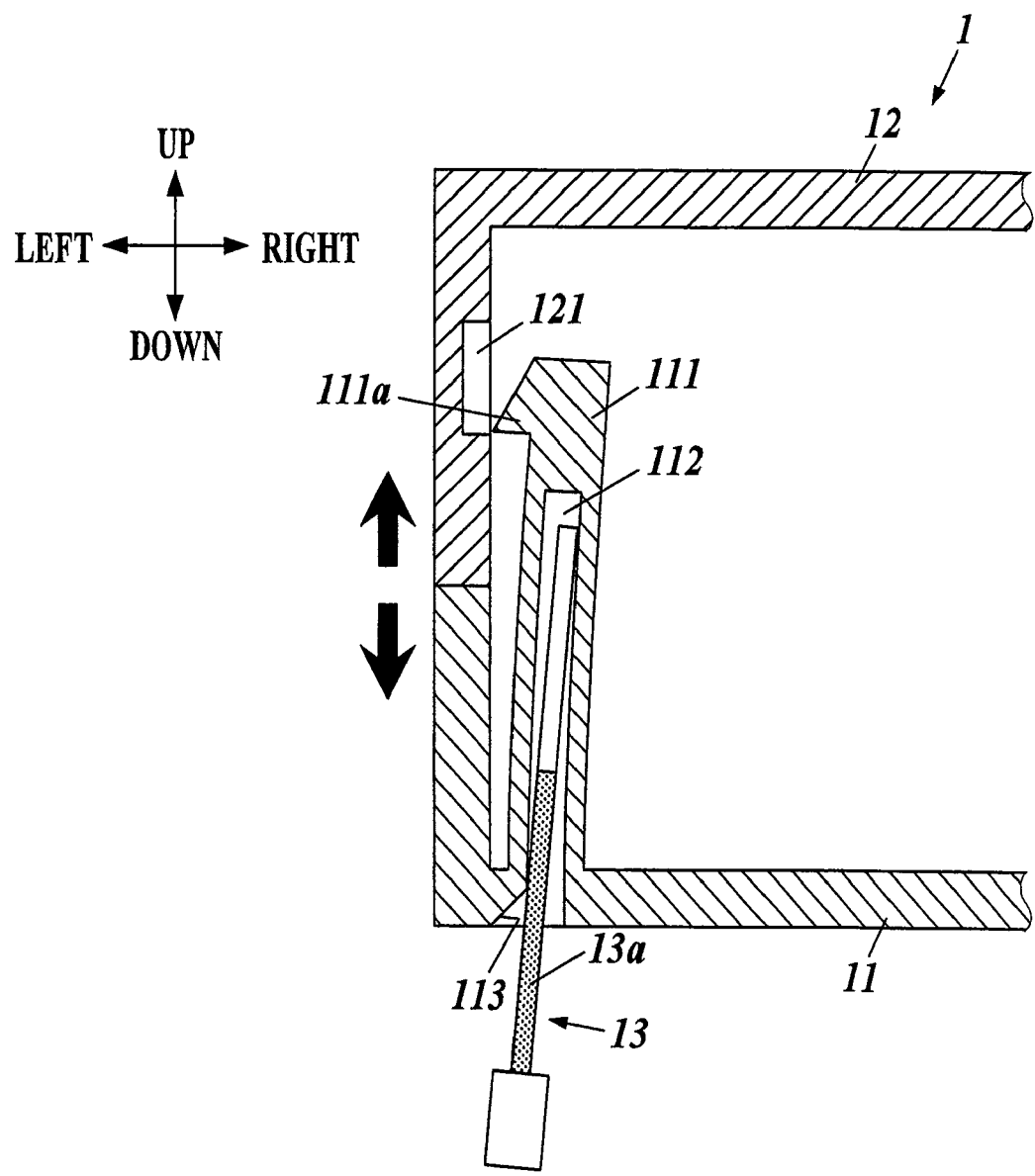
FIG. 5 is a principal part sectional view of a housing in the first embodiment, and a diagram showing a state where an engagement state of the hook and the engagement recess has been released.
Figure 6:
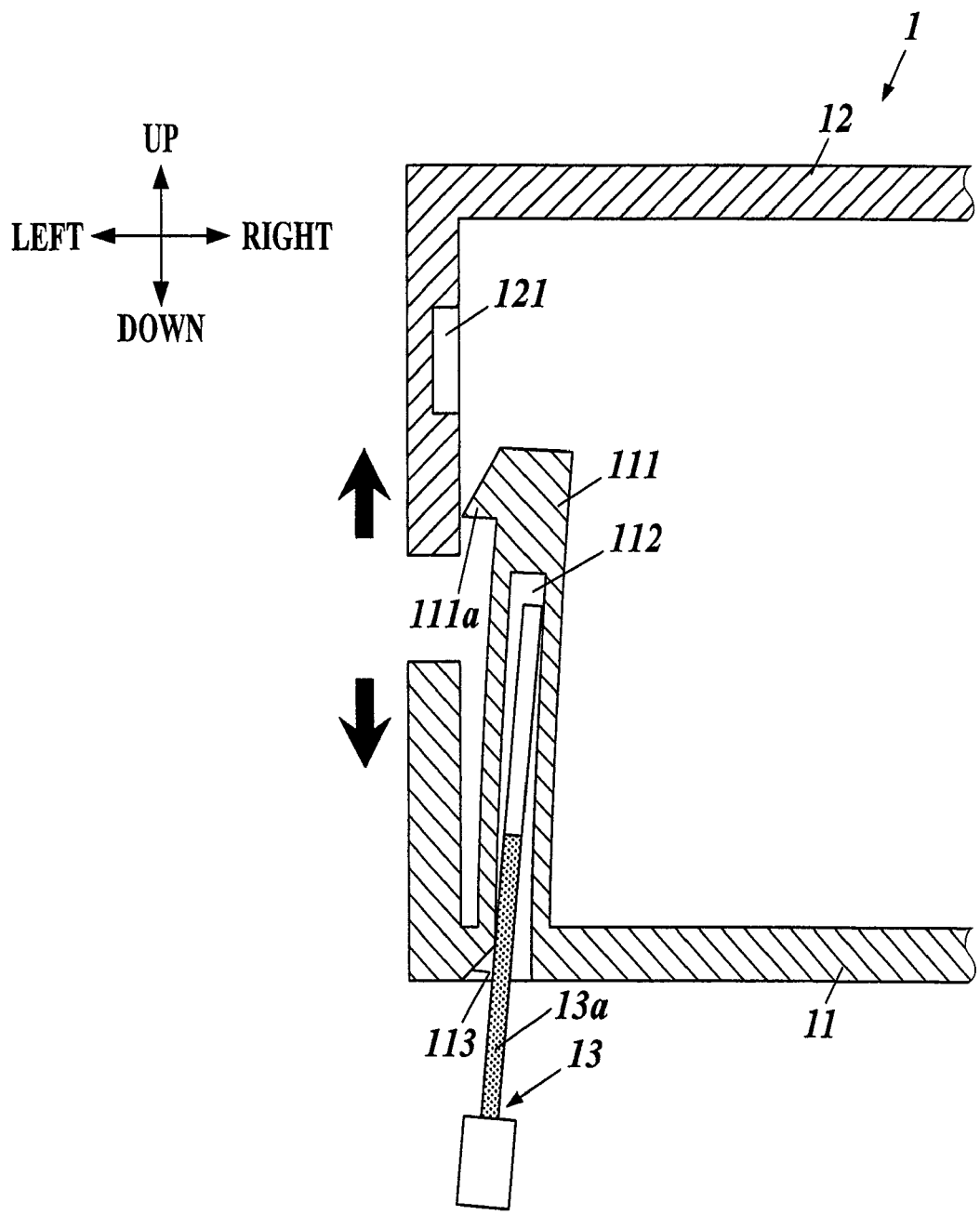
FIG. 6 is a principal part sectional view of a housing in the first embodiment, and a diagram showing a middle state where the first housing part and the second housing part are separated in a state where an engagement state of the hook and the engagement recess has been released.
Figure 7:
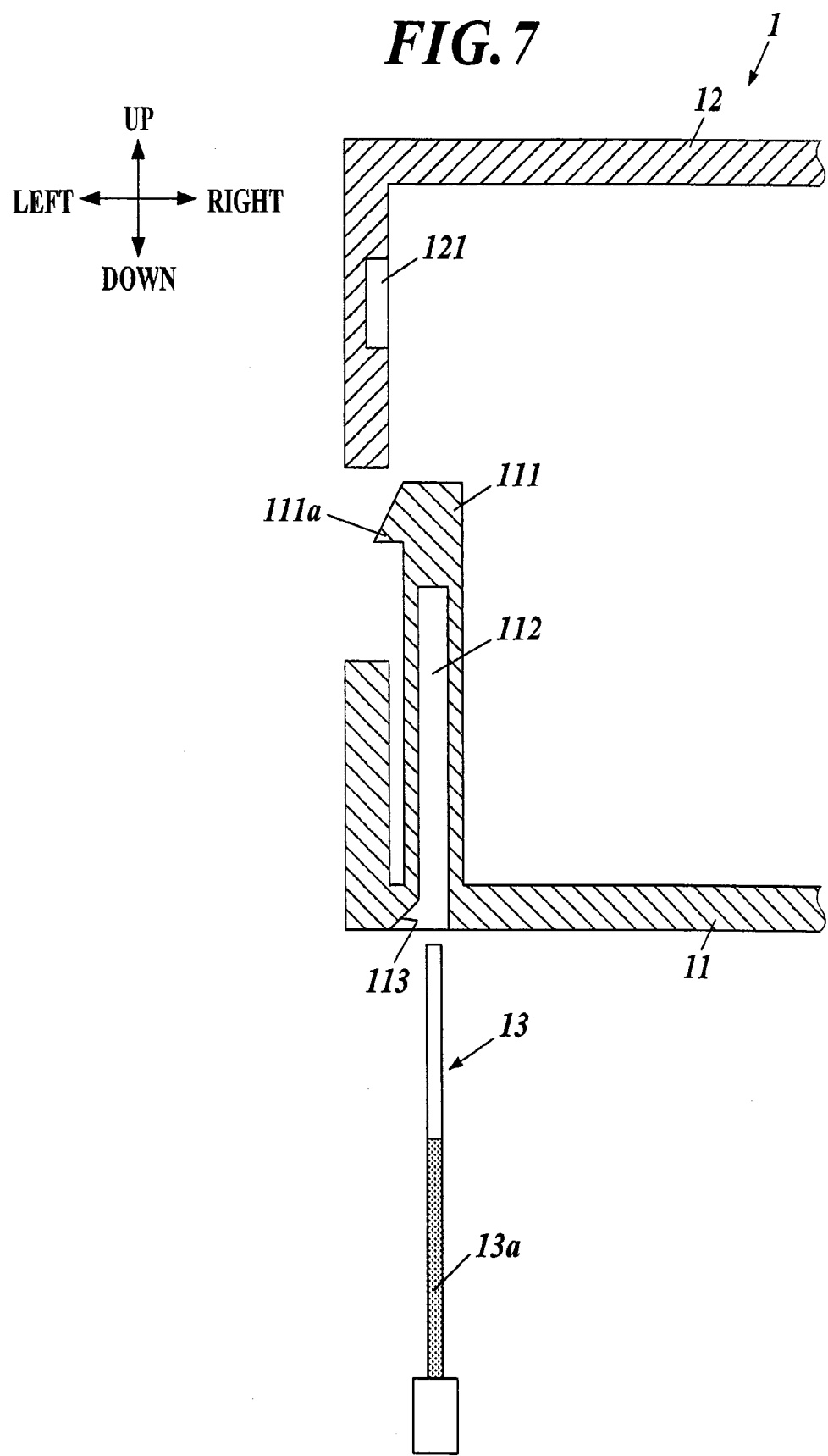
FIG. 7 is a principal part sectional view of a housing in the first embodiment, and a diagram showing a state where the housing has been disassembled into the first housing part and the second housing part.

Here, FIG. 3 is a diagram showing a state where the release member 13 is not inserted into the recess 112 in a state where a hook and an engagement recess have been engaged. FIG. 4 is a diagram showing a state where the release member 13 has been inserted into the recess 112 in a state where a hook and an engagement recess have been engaged. FIG. 5 is a diagram showing a state where an engagement state of the hook 111a and the engagement recess 121 has been released. FIG. 6 is a diagram showing a middle state where the first housing part 11 and the second housing part 12 are separated in a state where an engagement state of the hook 111a and the engagement recess 121 has been released. FIG. 7 is a diagram showing a state where the housing 1 has been disassembled into the first housing part 11 and the second housing part 12.

First, as shown in FIG. 3 and FIG. 4, the release member 13 formed almost in a bar shape is inserted into the recess 112 in a state where the hook 111a and the engagement recess 121 are engaged (an insertion step).

After that, as shown in FIG. 4 and FIG. 5, a tip of a part of the release member 13 inserted into the recess 112 is inclined to a direction (right direction in FIG. 4) opposite to the depth direction of the engagement recess 121 by moving a tip opposite to the part of the release member 13 inserted into the recess 112 to a depth direction (left direction in FIG. 4) of the engagement recess 121. Thereby, the engagement state of the hook 111a and the engagement recess 121 is released by bending the hook member 111 (a release step).

After that, as shown in FIG. 5 to FIG. 7, the housing 1 is disassembled to the first housing part 11 and the second housing part 12 by separating the first housing part 11 and the second housing part 12 in a state where the engagement state of the hook 111a and the engagement recess 121 are released (a disassembling step).

According to the housing 1 and the electronic equipment 1000 including the housing 1 in the first embodiment mentioned above, the housing 1 includes the first housing part 11, one side of which is an opening, including a hook member 111 having a hook 111a at its tip, and the second housing part 12, one side of which is an opening, having the engagement recess 121 to be engaged with the hook 111a in a side surface. The openings of the first housing part 11 and the second housing part 12 are closed by engaging the engagement recess 121 and the hook 111a to make a closed space inside. The hook member 111 has the recess 112 formed so as to be capable of inserting a release member 13 from the outer surface of the first housing part 11. The engagement state of the hook 111a and the engagement recess 121 is released by bending the hook member 111 using the release member 13 inserted into the recess 112.

Specifically, the hook member 111 is arranged almost in a vertical direction with respect to the depth direction of the engagement recess 121 in a state where the hook 111a and the engagement recess 121 are engaged, the recess 112 is extendedly provided from the outer surface of the first housing part 11 to inside of the hook member 111 almost in a vertical direction with respect to the depth direction of the engagement recess 121 in a state where the hook 111a and the engagement recess 121 are engaged, the engagement state of the hook 111a and the engagement recess 121 is released by (i) inserting the release member 13 formed almost in a bar shape into the recess 112, and (ii) inclining the tip of the releasing member 13 inserted into the recess 112 to a direction opposite to the depth direction of the engagement recess 121 to bend the hook member. The first housing part 11 has the notch portion 113 provided in position of the depth direction of the engagement recess 121 of the opening edge portion of the recess 112 in a state where the hook 111a and the engagement recess 121 are engaged.

That is, it is possible to release the engagement state of the hook 111a and the engagement recess 121 by a simple structure obtained by only providing the recess 112 to the hook member 111 without increasing the number of parts.

Then, since the recess 112 is provided to the hook member 111 and a penetration hole, and so on is not provided, it is possible to ensure the degree of closure of inside of the housing 1.

Also, when disassembling the housing 1 to execute fixing, and so on of the electronic equipment 1000, since the portion to be damaged is mainly a portion contacting the release member 13 inserted into the recess 112 and difficult to see from outside of the housing 1, it is possible to reduce the damage of the outside view when disassembling it.

Further, in the conventional housing, though there is a case that it is difficult to release the engagement state of the hook because position of the hook can not be judged from the outside view, it is possible to easily disassemble the housing 1 because the engagement state of the hook is released by inserting the release member 13 into the recess 112 capable of easily judging from the outside view and inclining it.

Also, the downward force is applied to the side surface (left side) to which the engagement recess 121 is provided in the second housing part 12 by the engagement of the hook 111a and the engagement recess 121. Also, it is possible to catch a portion lower than the engagement recess 121 of the side surface (left side) of the second housing part 12 and the side surface (left side) of the first housing part 11 by the hook 111a and a surface opposite to the opening of the first housing part 11 so as to certainly contact a lower end of the side surface (left side) of the second housing part 12 and an upper surface of the side surface (left side) of the first housing part 11 without gap. Accordingly, it is possible to certainly close inside of the housing 1.

Also, according to the housing 1 and the electronic equipment 1000 including the housing 1 in the first embodiment mentioned above, as a preferable release member 13, the release member 13 is covered by a predetermined elastic member 13a in at least a portion opposite to the opening edge portion of the recess 112 when the release member 13 is inserted into the recess 112.

Accordingly, though the portion opposite to the opening edge portion of the recess 112 in the release member 13 contacts the opening edge portion of the recess 112 when the engagement state of the hook 111a and the engagement recess 121 is released, it is possible to reduce the damage of the outside view when disassembling it because it is covered by the predetermined elastic member 13a to reduce the damage of the opening edge portion of the recess 112 caused by contacting it.

According to a disassembly method of disassembling the housing to the first housing part 11 and the second housing part 12 in the first embodiment mentioned above, the disassembly method comprises an insertion step of inserting the release member 13 formed almost in a bar shape to the recess 112, a release step of releasing the engagement state of the hook 111a and the engagement recess 121 by inclining the tip of the releasing member 13 inserted into the recess 112 to a direction opposite to the depth direction of the engagement recess 121 to bend the hook member 111, a disassembling step of disassembling the housing 1 to the first housing part 11 and the second housing part 12 by separating the first housing part 11 and the second housing part 12 in a state where the engagement state of the hook 111a and the engagement recess 121 are released.

That is, by a simple method of bending the hook member 111 by the releasing member 13 inserted into the recess 112, it is possible to releasing the engagement state of the hook 111a and the engagement recess 121 and disassembling the housing 1 to the first housing part 11 and the second housing part 12.

Second Embodiment

Next, a housing 2, an electronic equipment 2000 having the housing 2, and a disassembly method of disassembling a housing 2 to a first housing part 21 and a second housing part 12 will be described.

In addition, the housing 2 and the electronic equipment 2000 in the second embodiment are different from the first embodiment only for the reasons that the first housing part 21 does not have the notch portion 113 and the release member 23 is formed in a bow shape. Also, the disassembly method of the second embodiment is different from the first embodiment only for the reason that the release member 23 inserted into the recess 112 is not inclined when releasing the engagement state of the hook 111a and the engagement recess 121. Accordingly, only different points are mainly described and other common portions are described referring the same signs.

Figure 8:
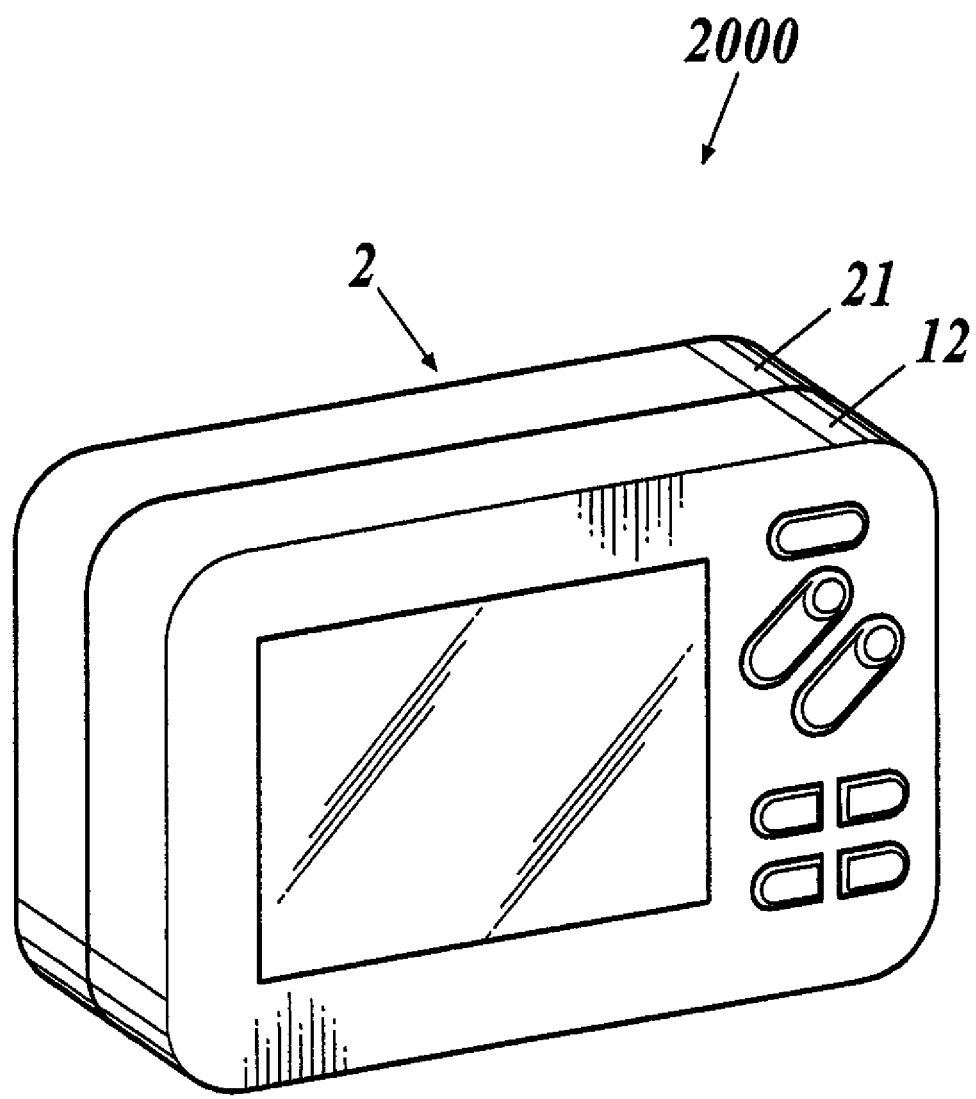
FIG. 8 is a front perspective diagram of a portable television as an example of an electronic equipment in the second embodiment.
Figure 9:
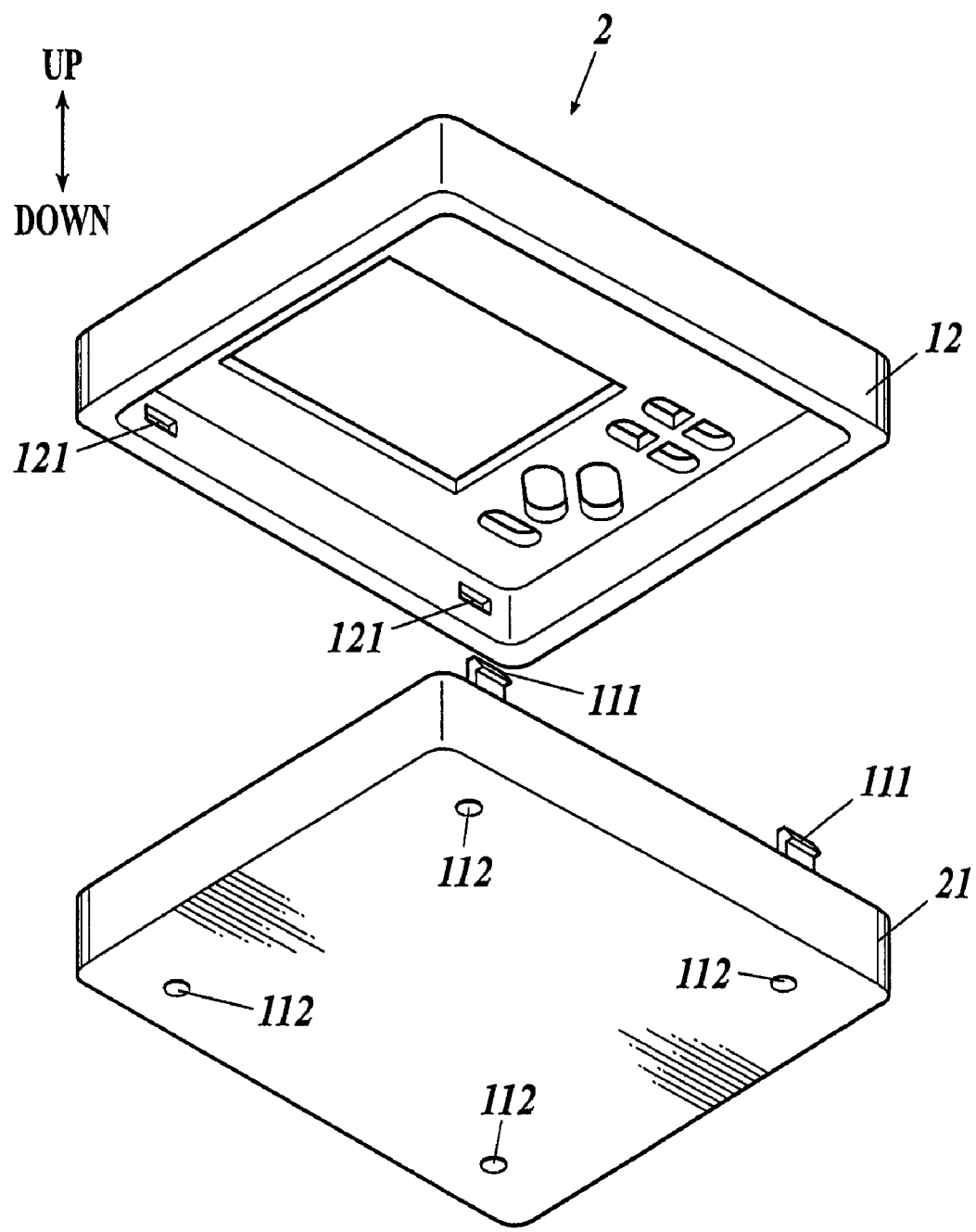
FIG. 9 is a back perspective diagram showing a state where a housing in the second embodiment has been disassembled to a first housing part and a second housing part.

Here, FIG. 8 is a front perspective diagram of a portable television as an example of an electronic equipment 2000, FIG. 9 is a back perspective diagram showing a state where the housing 2 has been disassembled to the first housing part 21 and a second housing part 12, and FIGS. 10-13 are a principal part sectional view of the housing 2.

<Electronic Equipment>

For example, as shown in FIG. 8, the electronic equipment 2000 includes the housing 2 obtained by combining the first housing part 21 and the second housing part 12.
<Housing>

Figure 10:
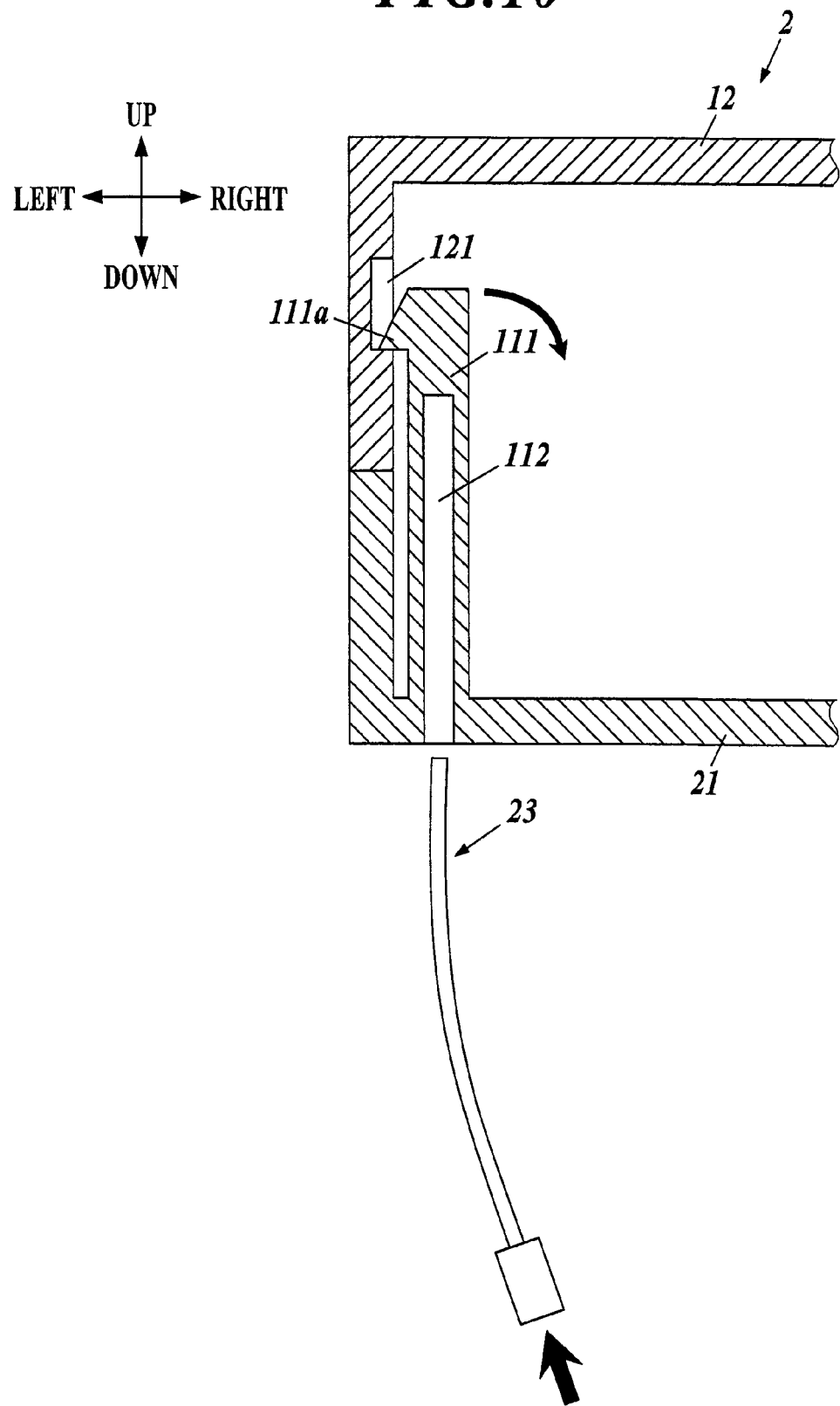
FIG. 10 is a principal part sectional view of a housing in the second embodiment in a state where a hook and an engagement recess have been engaged, and a diagram showing a state where the release member is not inserted into a recess.

For example, as shown in FIG. 8 to FIG. 10, the housing 2 is obtained by combining the first housing part 21 and the second housing part 12.

In addition, in the housing 2, since the point different from the housing 1 of the first embodiment is only for the reason that the first housing part 21 does not have the notch portion 113, the detailed description will be omitted.
<Release Member>

For example, as shown in FIG. 10, the release member 23 is a member formed almost in a bow shape to be used when releasing the engagement state of the hook 111a and the engagement recess 121. As the release member 23, a tool commercially available or a dedicated member for disassembling the housing 2 to the first housing part 21 and the second housing part 12 may be used if it is formed almost in the bow shape and difficult to bend in comparison with the hook member 111.

Here, the bend condition of the release member 23 is arbitrary if the hook member 111 can be bent by only inserting the release member 23 into the recess 112 to release the engagement state of the hook 111a and the engagement recess 12.

In addition, the release member 23 does not need to be covered by the predetermined elastic member 13a, or may be covered.
<Disassembly Method of Housing>

A disassembly method of the housing for disassembling the housing 2 to the first housing part 21 and the second housing part 12 will be described in view of FIG. 10 to FIG. 13.

Figure 11:
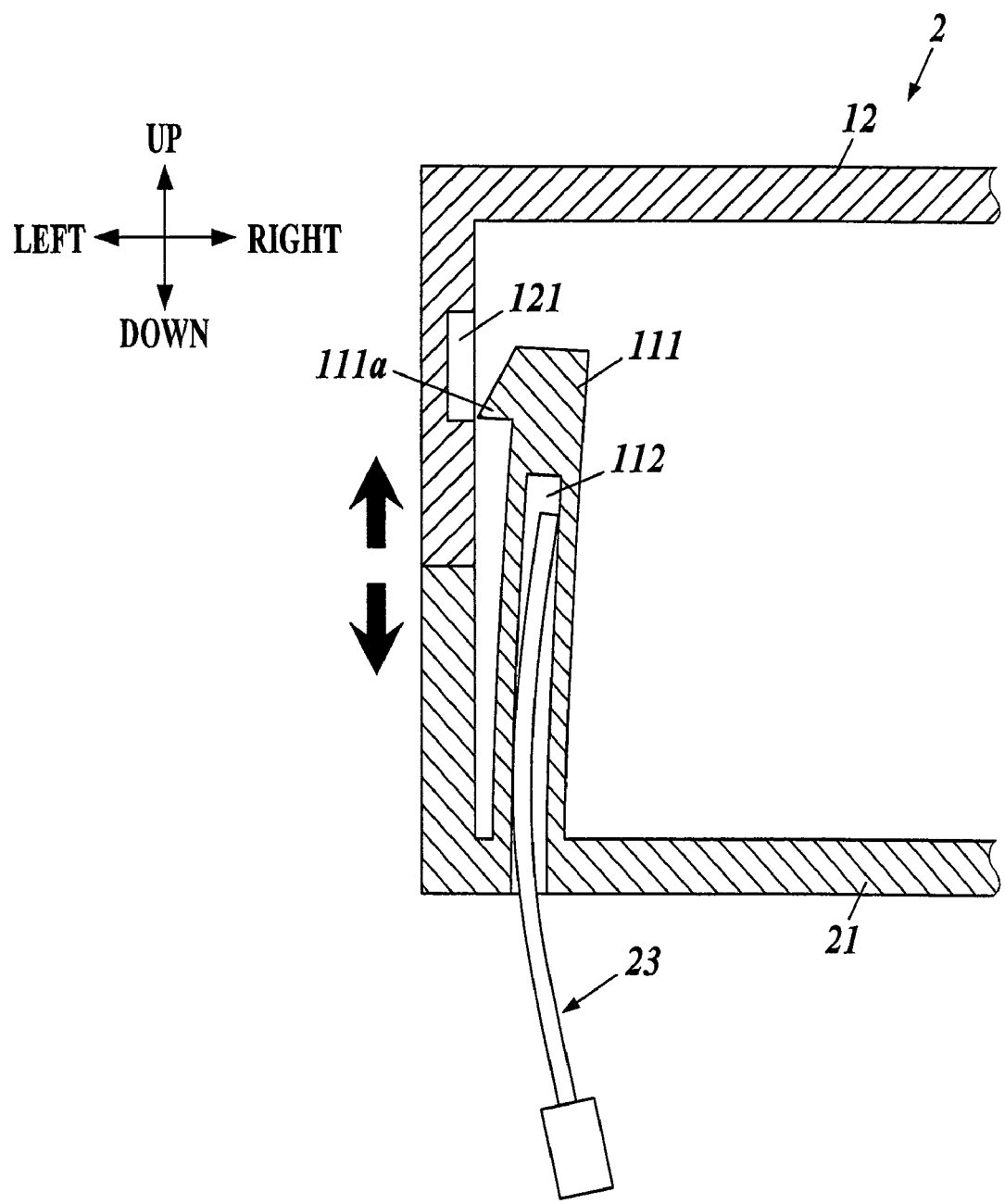
FIG. 11 is a principal part sectional view of a housing in the second embodiment, and a diagram showing a state an engagement state of the hook and the engagement recess has been released.
Figure 12:
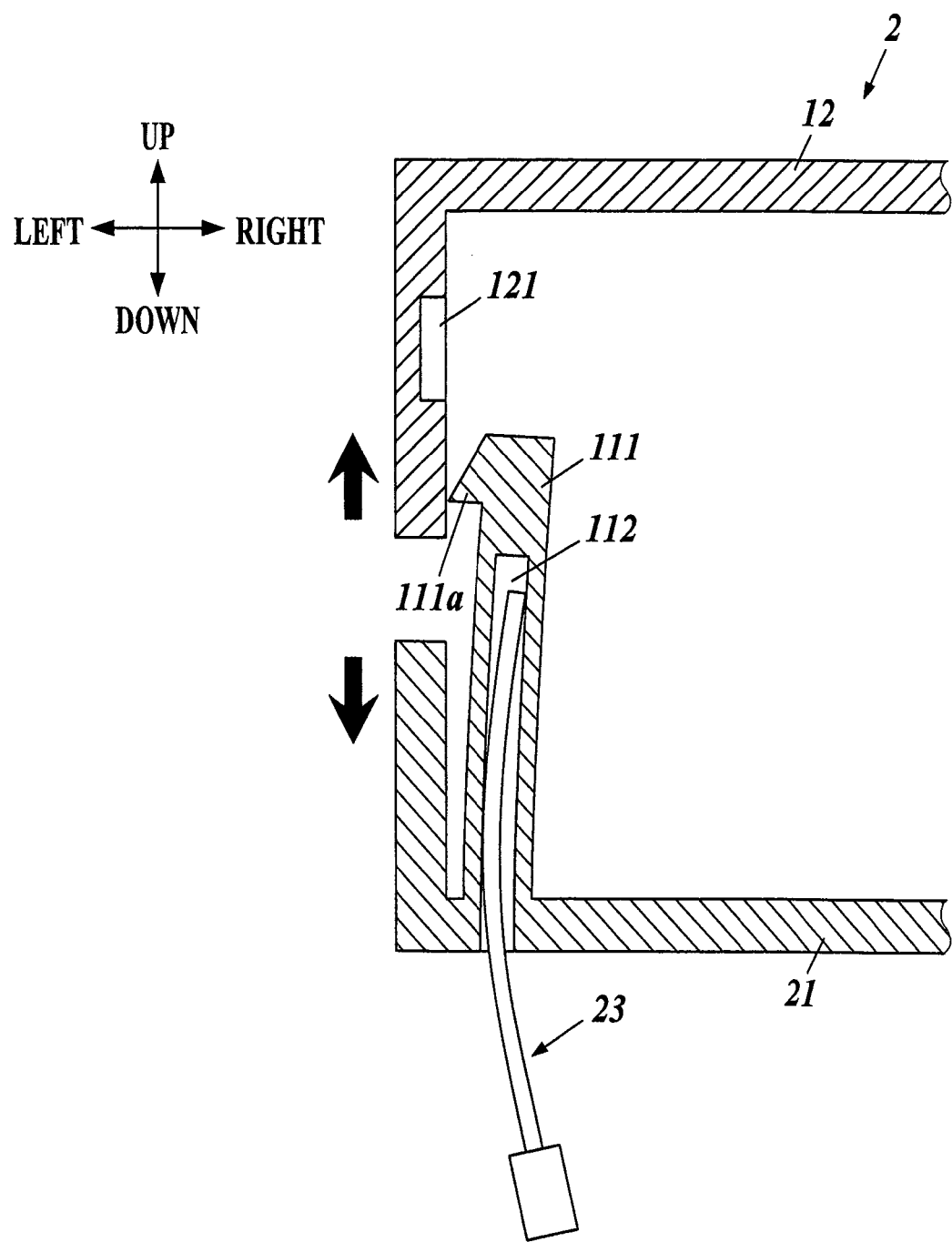
FIG. 12 is a principal part sectional view of a housing in the second embodiment, and a diagram showing a middle state where the first housing part and the second housing part is separated in a state where an engagement state of the hook and the engagement recess has been released.
Figure 13:
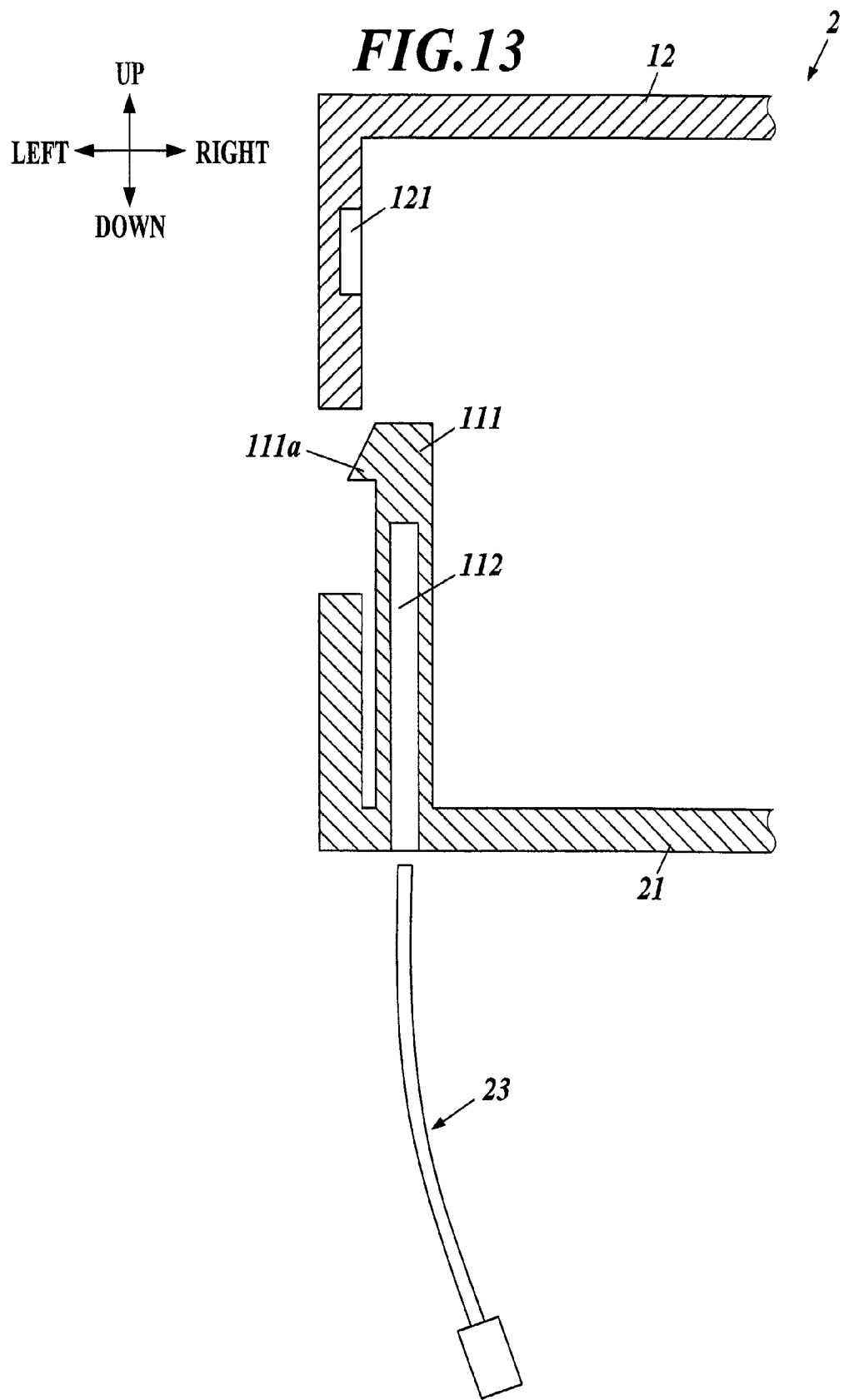
FIG. 13 is a principal part sectional view of a housing in the second embodiment, and a diagram showing a state where the housing has been disassembled into the first housing part and the second housing part.

Here, FIG. 10 is a diagram showing a state where the release member 23 is not inserted into a recess 112 in a state where the hook 111a and the engagement recess 121 have been engaged. FIG. 11 is a diagram showing a state where an engagement state of the hook 111a and the engagement recess 121 has been released. FIG. 12 is a diagram showing a middle state where the first housing part 21 and the second housing part 12 are separated in a state where an engagement state of the hook 111a and the engagement recess 121 has been released. FIG. 13 is a diagram showing a state where the housing 2 has been disassembled into the first housing part 21 and the second housing part 12.

First, as shown in FIG. 10 and FIG. 11, the release member 23 formed almost in a bow shape is inserted into the recess 112 in a state where the hook 111a and the engagement recess 121 are engaged. Thereby, the engagement state of the hook 111a and the engagement recess 121 is released by bending the hook member 111 (the insertion release step).

After that, as shown in FIG. 11 to FIG. 13, the housing 2 is disassembled to the first housing part 21 and the second housing part 12 by separating the first housing part 21 and the second housing part 12 in a state where the engagement state of the hook 111a and the engagement recess 121 are released (a disassembling step).

According to the housing 2, the electronic equipment 2000 having the housing 2, and the disassembly method of disassembling the housing 2 to the first housing part 21 and the second housing part 12 in the second embodiment mentioned above, it is possible to release the engagement state of the hook 111a and the engagement recess 121 by only inserting the release member 23 into the recess 112 to bend the hook member 111 because the release member 23 is formed almost in a bow shape.

Also, since it is possible to release the engagement state of the hook 111a and the engagement recess 121 by only inserting the release member 23 into the recess 112, it is not necessary to provide the notch portion 113 of the first housing part 21.

Moreover, the invention is not limited to the above mentioned embodiment, and the embodiments can be changed in the range which does not deviate from the outline of the invention.
(Modification 1)

In the first embodiment, though the engagement recess 121 is provided on the side surface of the second housing part 12 and the hook member 111 is provided near the side surface of the first housing part 11, it is not limited to this.

Figure 14:
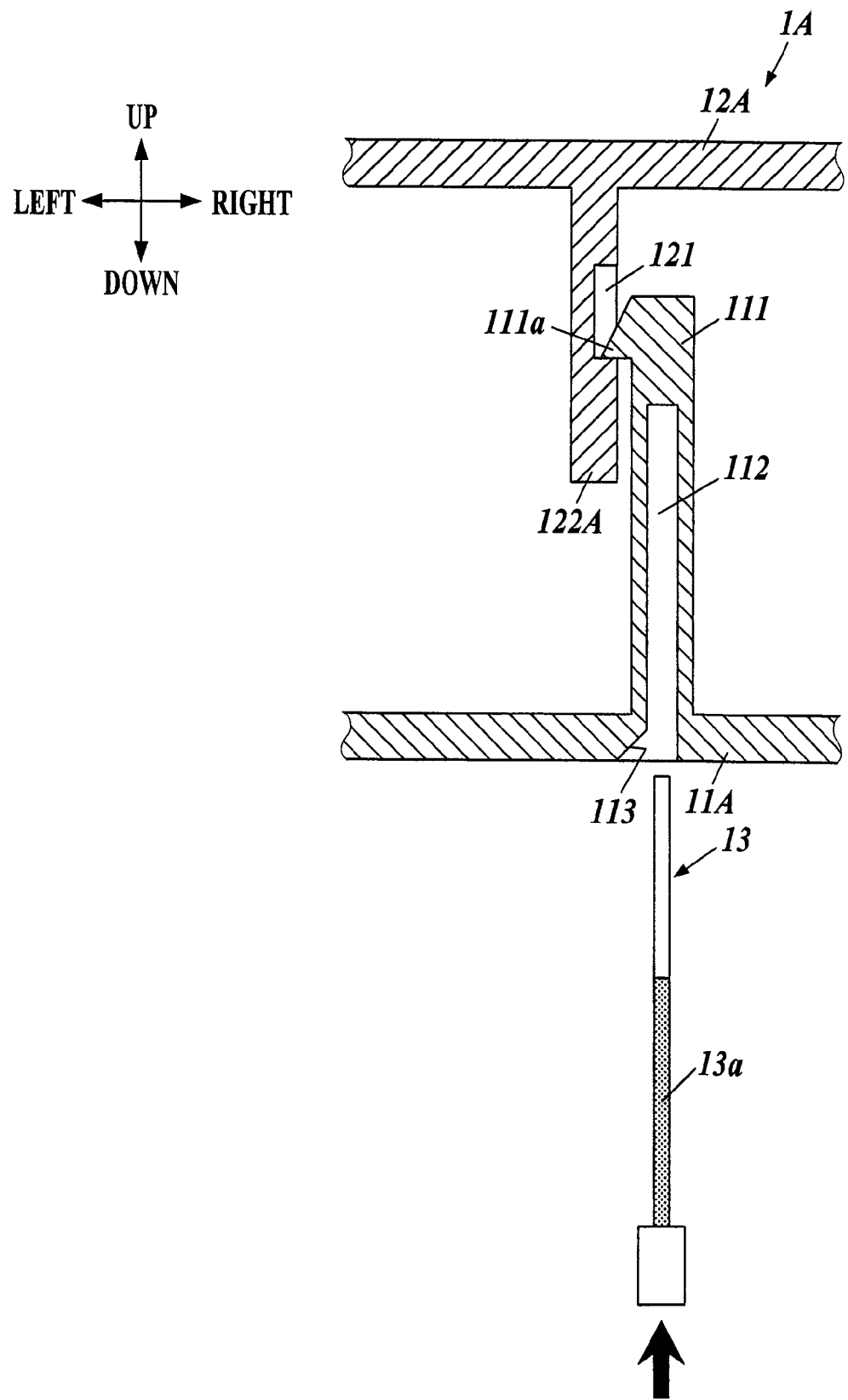
FIG. 14 is a principal part sectional view of a housing as modification in the second embodiment in a state where a hook and an engagement recess have been engaged, and a diagram showing a state where the release member is not inserted into a recess.

Specifically, for example, as shown in FIG. 14, as the housing 1, a housing 1A obtained by combining the first housing part 11A and the second housing part 12A may be used.

Specifically, the housing 1A comprises a first housing part 1A, one side of which is an opening, including a hook member 111 having a hook 111a at its tip and projected from an inner surface thereof, and a second housing part 12A, one side of which is an opening, including an engagement recess portion 122A having an engagement recess 121 to be engaged with the hook 111a and projected from an inner surface thereof.

For example, the engagement recess portion 122A is arranged in position between a first side surface and a second side surface opposite to the first side surface of the second housing part 12A.

For example, the hook member 111 is arranged in position capable of engaging the hook 111a and the engagement recess 121 in a state where a closed space is made inside of the housing 1A.

Also, it is the same in the second embodiment.

Also, in the first embodiment, it is not limited to have the housing 1 to the electronic equipment 1000, and it is arbitrary.

Also, it is the same in the second embodiment.

Also, in the first embodiment, if the housing 1 includes at least the first housing part 11 and the second housing part 12, the housing 1 may also include another housing part.

Also, it is the same in the second embodiment.

According to the invention, a housing comprises a first housing part, one side of which is an opening, including a hook member having a hook at its tip and projected from an inner surface thereof, and a second housing part, one side of which is an opening, having an engagement recess to be engaged with the hook, wherein the openings of the first housing part and the second housing part are closed by engaging the engagement recess and the hook to make a closed space inside, the hook member has a recess to which a release member is insertable from an outer surface of the first housing part, an engagement state of the hook and the engagement recess is released by bending the hook member by the release member inserted into the recess of the engagement recess.

That is, it is possible to release the engagement state of the hook and the engagement recess by a simple structure obtained by only providing the recess to the hook member without increasing the number of parts.

Then, since the recess is provided to the hook member and a penetration hole, and so on is not provided, it is possible to ensure the degree of closure of inside of the housing.

Also, since the portion to be damaged is mainly a portion contacting the release member inserted into the recess and difficult to see from outside of the housing, it is possible to reduce the damage of the outside view when disassembling it.

Further, by a simple method of bending the hook member by the releasing member inserted into the recess, it is possible to releasing the engagement state of the hook and the engagement recess and disassembling the housing to the first housing part and the second housing part.

The entire disclosure of Japanese Patent Applications No. 2008-013849 filed on Jan. 24, 2008 including specifications, claims, drawings and summaries are incorporated herein by reference in their entirety.

What is claimed is:

1. A housing, comprising:
a first housing part, one side of which is an opening, including a hook member having a hook at its tip and projected from an inner surface thereof; and
a second housing part, one side of which is an opening, having an engagement recess to be engaged with the hook,
wherein the openings of the first housing part and the second housing part are closed by engaging the engagement recess and the hook to make a closed space inside,
the hook member has a recess to which a release member is insertable from an outer surface of the first housing part,
an engagement state of the hook and the engagement recess is released by bending the hook member by the release member inserted into the recess of the hook member, and
the recess is extendedly provided from the outer surface of the first housing part to inside of the hook member, and when the closed space is made, the recess is separated from the closed space.

2. The housing according to claim 1, wherein
the hook member is arranged almost in a vertical direction with respect to an engagement recess depth direction in a state where the hook and the engagement recess are engaged,
the recess of the hook member is extendedly provided from the outer surface of the first housing part to inside of the hook member almost in a vertical direction with respect to the engagement recess depth direction in a state where the hook and the engagement recess are engaged,
the engagement state of the hook and the engagement recess is released by inserting the release member formed almost in a bar shape into the recess of the hook member and inclining the tip of the inserted releasing member to a direction opposite to the engagement recess depth direction to bend the hook member, and
the first housing part has a notch portion in position of the engagement recess depth direction in an opening edge portion of the recess of the hook member in a state where the hook and the engagement recess are engaged.

3. The housing according to claim 1, wherein
the hook member is arranged almost in a vertical direction with respect to the engagement recess depth direction in a state where the hook and the engagement recess are engaged,
the recess of the hook member is extendedly provided from the outer surface of the first housing part to inside of the hook member almost in a vertical direction with respect to the engagement recess depth direction in a state where the hook and the engagement recess are engaged, and
the engagement state of the hook and the engagement recess is released by inserting the release member formed almost in a bow shape into the recess of the hook member and bending the hook member by the inserting.

4. An electronic equipment comprising the housing according to claim 1.

5. A housing disassembly method of disassembling a housing to a first housing part, one side of which is an opening, including a hook member having a hook at its tip and projected from an inner surface thereof, and a second housing part, one side of which is an opening, having an engagement recess to be engaged with the hook, wherein
the openings of the first housing part and the second housing part are closed by engaging the engagement recess and the hook to make a closed space inside,
the hook member has a recess to which a release member is insertable from an outer surface of the first housing part,
an engagement state of the hook and the engagement recess is released by bending the hook member by the release member inserted into the recess of the hook member,
the recess is extendedly provided from the outer surface of the first housing part to inside of the hook member, and when the closed space is made, the recess is separated from the closed space,
the hook member is arranged almost in a vertical direction with respect to an engagement recess depth direction in a state where the hook and the engagement recess are engaged,
the recess of the hook member is extendedly provided from the outer surface of the first housing part to inside of the hook member almost in a vertical direction with respect to the engagement recess depth direction in a state where the hook and the engagement recess are engaged, the release member is formed almost in a bar shape, and the first housing part has a notch portion in position of the engagement recess depth direction in an opening edge portion of the recess of the hook member in a state where the hook and the engagement recess are engaged, the method comprising:

an insertion step of inserting the release member into the recess, which is separated from the closed space and extendedly provided from the outer surface of the first housing part to the inside of the hook member;

a release step of releasing the engagement state of the hook and the engagement recess by inclining the tip of the releasing member inserted into the recess of the hook member to a direction opposite to the engagement recess depth direction to bend the hook member; and a disassembling step of disassembling the housing to the first housing part and the second housing part by separating the first housing part and the second housing part in a state where the engagement state of the hook and the engagement recess are released, wherein the release member is covered by a predetermined elastic member in at least a portion opposite to the opening edge portion of the recess of the hook member when the release member is inserted into the recess of the hook member.

6. A housing disassembling method of disassembling a housing to a first housing part, one side of which is an opening, including a hook member having a hook at its tip and projected from an inner surface thereof, and a second housing part, one side of which is an opening, having an engagement recess to be engaged with the hook, wherein the openings of the first housing part and the second housing part are closed by engaging the engagement recess and the hook to make a closed space inside, the hook member has a recess to which a release member is insertable from an outer surface of the first housing part, an engagement state of the hook and the engagement recess is released by bending the hook member by the release member inserted into the recess of the hook member, the recess is extendedly provided from the outer surface of the first housing part to inside of the hook member, and when the closed space is made, the recess is separated from the closed space, the hook member is arranged almost in a vertical direction with respect to the engagement recess depth direction in a state where the hook and the engagement recess are engaged, the recess of the hook member is extendedly provided from the outer surface of the first housing part to inside of the hook member almost in a vertical direction with respect to the engagement recess depth direction in a state where the hook and the engagement recess are engaged, and the release member is formed almost in a bow shape, the method comprising:

an insertion release step of releasing the engagement state of the hook and the engagement recess by inserting the release member into the recess, which is separated from the closed space and extendedly provided from the outer surface of the first housing part to the inside of the hook member, and bending the hook member by the inserting; and a disassembling step of disassembling the housing to the first housing part and the second housing part by separating the first housing part and the second housing part in a state where the engagement state of the hook and the engagement recess are released.

* * * * *